(12) United States Patent
Kageyama

(10) Patent No.: US 8,119,519 B2
(45) Date of Patent: Feb. 21, 2012

(54) SEMICONDUCTOR DEVICE MANUFACTURING METHOD

(75) Inventor: Satoshi Kageyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/945,446

(22) Filed: Nov. 12, 2010

(65) Prior Publication Data

US 2011/0059607 A1    Mar. 10, 2011

Related U.S. Application Data

(62) Division of application No. 11/579,339, filed as application No. PCT/JP2005/019422 on Oct. 21, 2005, now Pat. No. 7,834,459.

(30) Foreign Application Priority Data

Oct. 26, 2004  (JP) ................................. 2004-310735

(51) Int. Cl.
*H01L 21/768* (2006.01)

(52) U.S. Cl. ........ 438/626; 438/625; 257/773; 257/637; 257/640; 257/774; 257/752; 257/758; 257/E21.577; 257/E21.578; 257/E21.588; 257/E21.585; 257/E23.145; 257/E21.597; 257/E21.641; 257/E21.586

(58) Field of Classification Search .................. 257/752, 257/773, 758, 632, E21.577, E21.629, E21.585; 438/626, 625

See application file for complete search history.

(56) References Cited

U.S. PATENT DOCUMENTS

| | | | |
|---|---|---|---|
| 4,944,836 A | 7/1990 | Beyer et al. | |
| 6,930,391 B2 * | 8/2005 | Kloster et al. | 257/741 |
| 7,256,502 B2 * | 8/2007 | Chung | 257/774 |
| 2001/0044201 A1 * | 11/2001 | Kudo et al. | 438/622 |
| 2004/0056344 A1 * | 3/2004 | Ogawa et al. | 257/686 |
| 2004/0152334 A1 * | 8/2004 | Ohto et al. | 438/758 |
| 2004/0173905 A1 | 9/2004 | Kamoshima et al. | |
| 2005/0064699 A1 * | 3/2005 | Kondo et al. | 438/624 |

FOREIGN PATENT DOCUMENTS

| | | |
|---|---|---|
| JP | 09-045782 | 2/1997 |
| JP | 2004-273523 | 9/2004 |
| JP | 2004-289004 | 10/2004 |

* cited by examiner

*Primary Examiner* — Marc Armand

(74) *Attorney, Agent, or Firm* — Rabin & Berdo, P.C.

(57) ABSTRACT

A method for making a semiconductor device including at least three interconnection layers sequentially stacked without intervention of a via layer. At least one of the interconnection layers includes an interconnection and a via which connects interconnections provided in interconnection layers underlying and overlying the one interconnection layer.

12 Claims, 11 Drawing Sheets

210 : SiO₂ FILM
200 : SUBSTRATE

212 : SiC FILM
210
200

He PLASMA
220 : low-k FILM
212
210
200

222 : SiO₂ FILM
220
212
210
200

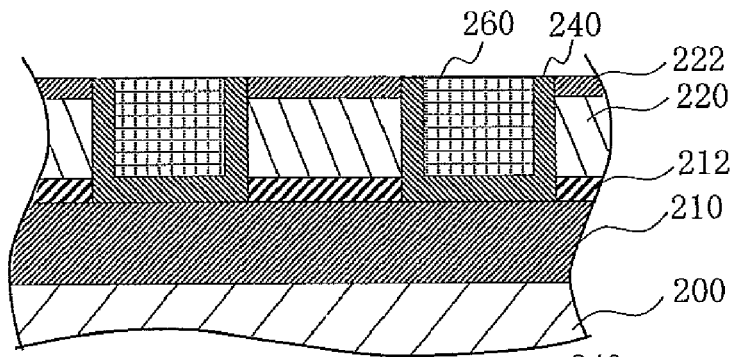
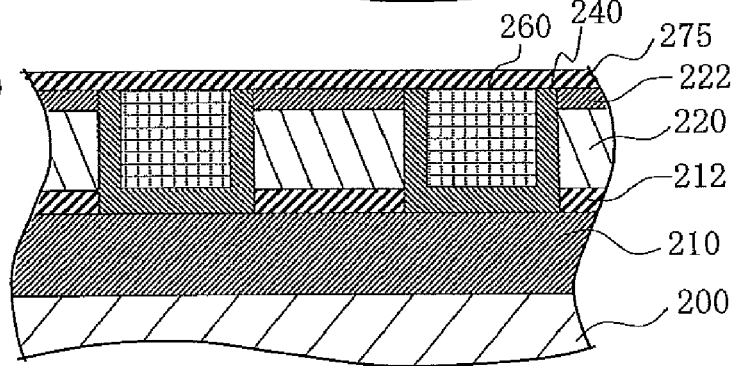
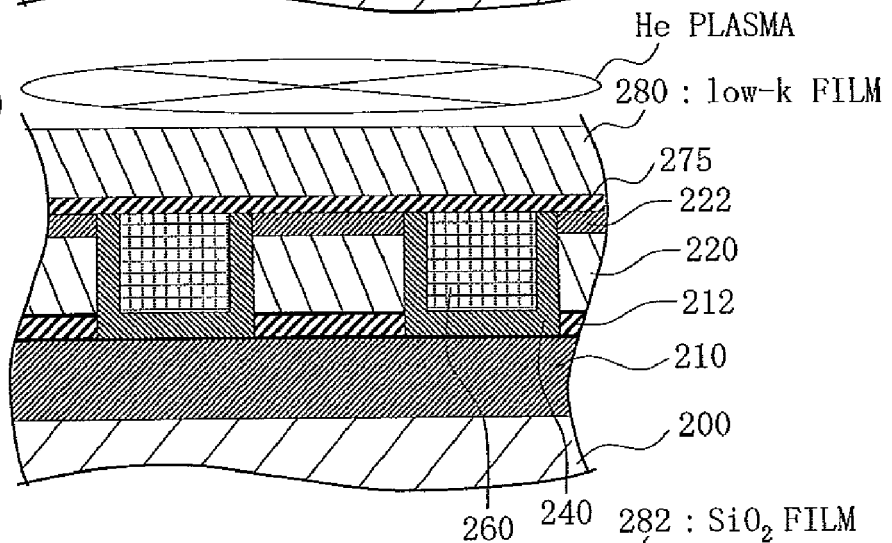
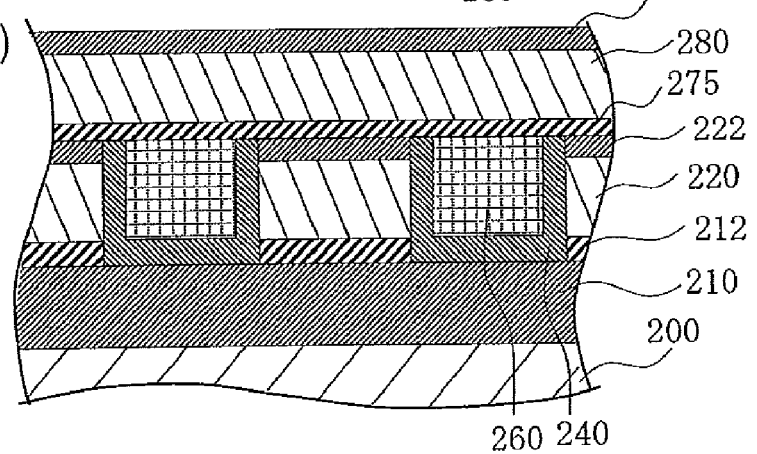

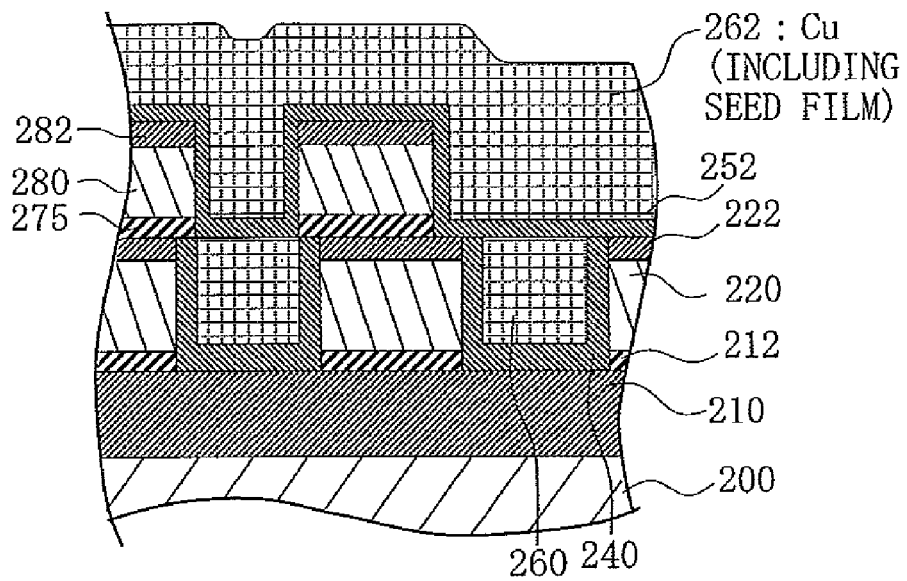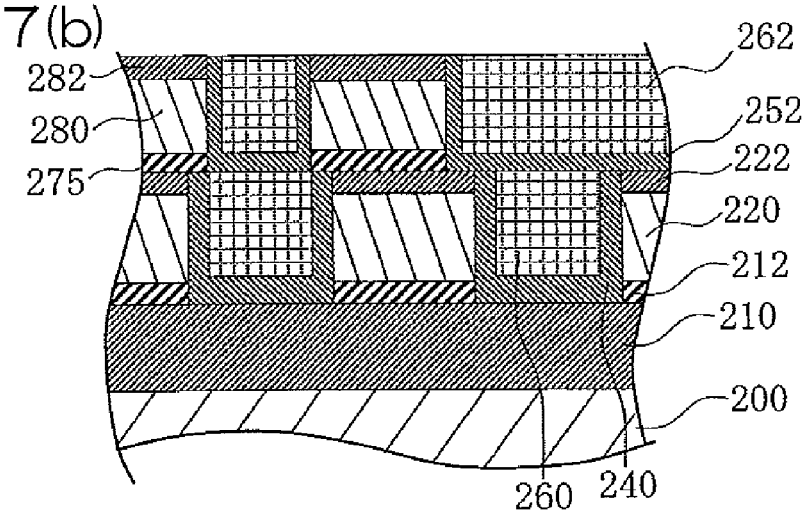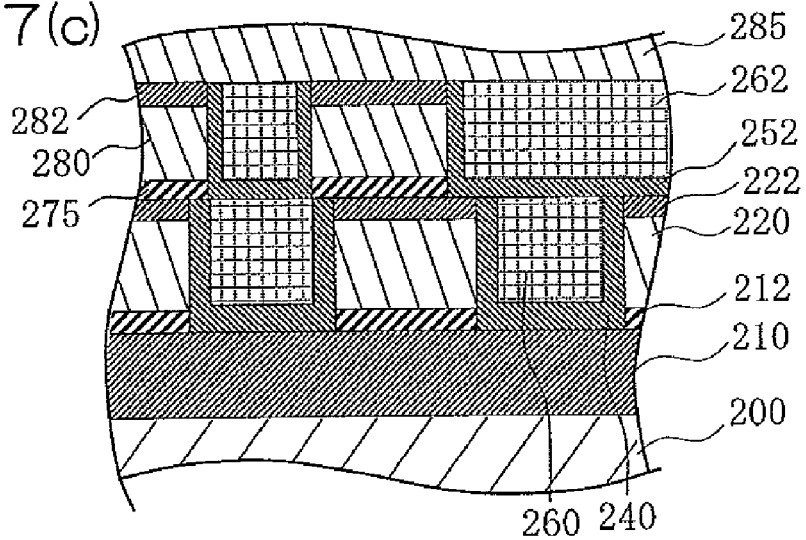

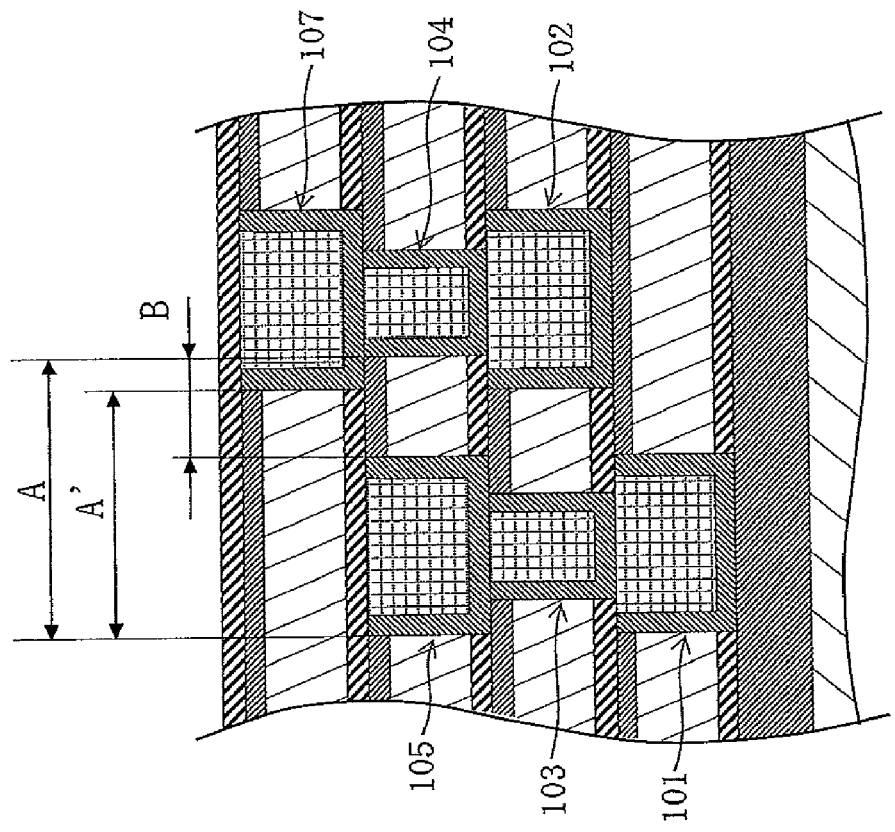
FIG. 8(b) EMBODIMENT
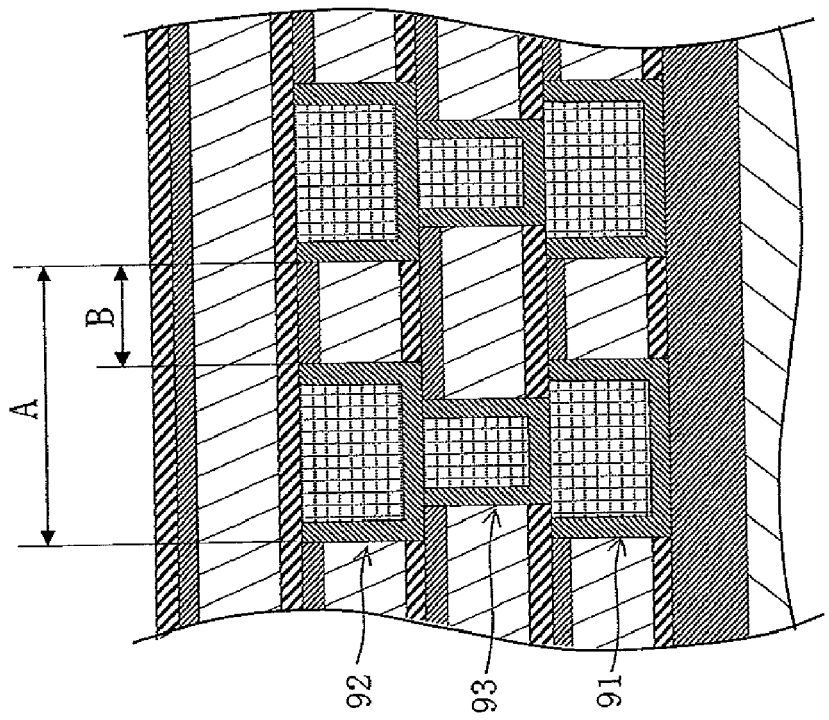
FIG. 8(a) PRIOR ART
A > A'

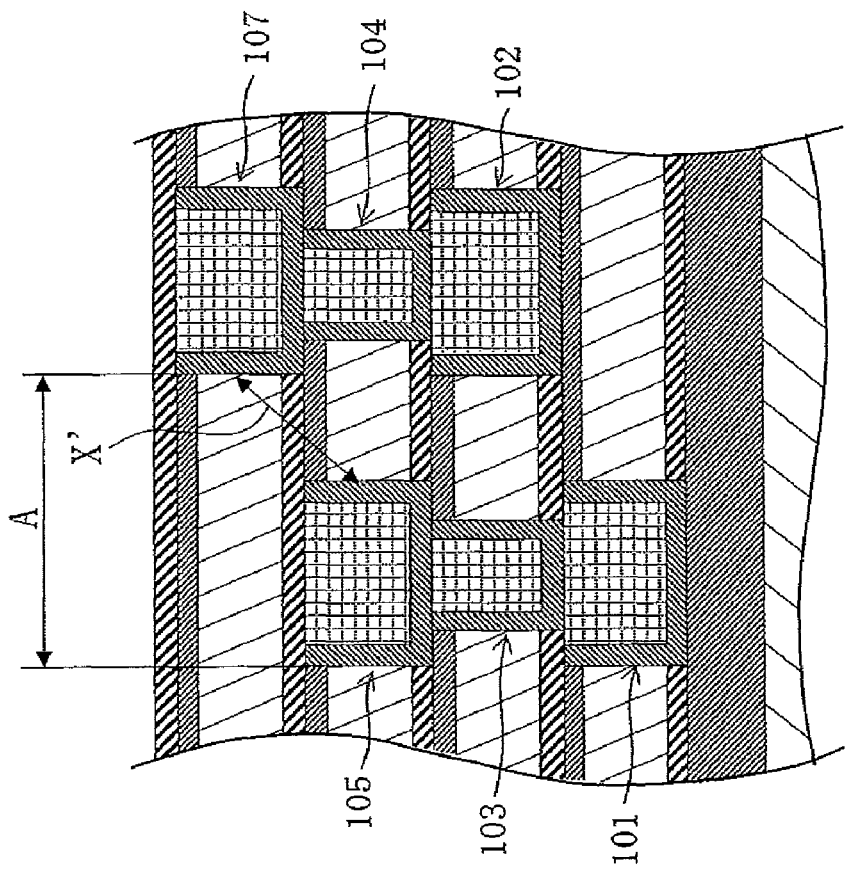
FIG. 9(b) EMBODIMENT
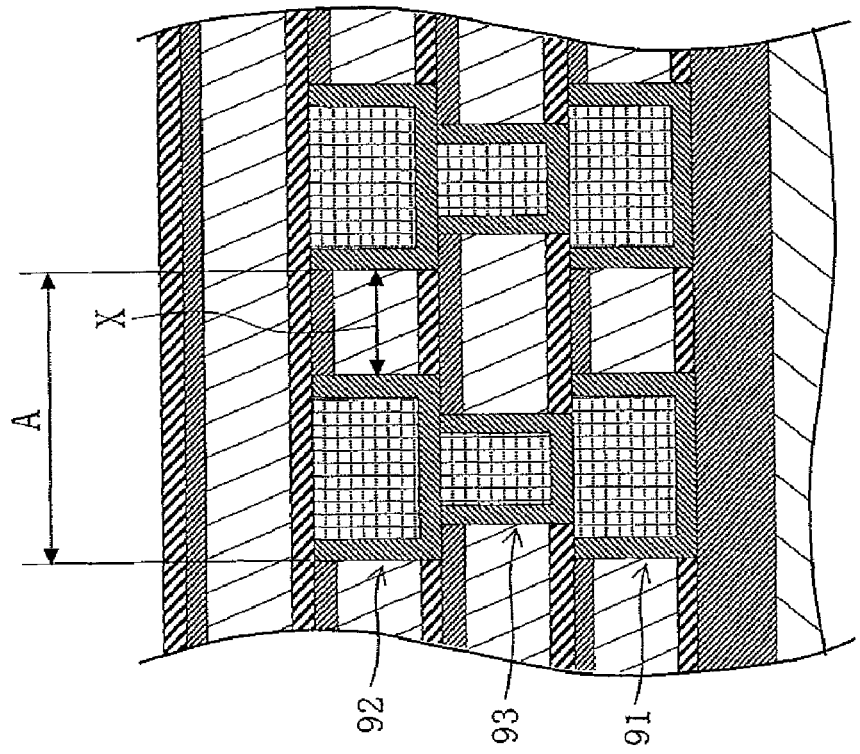
FIG. 9(a) PRIOR ART
X < X'

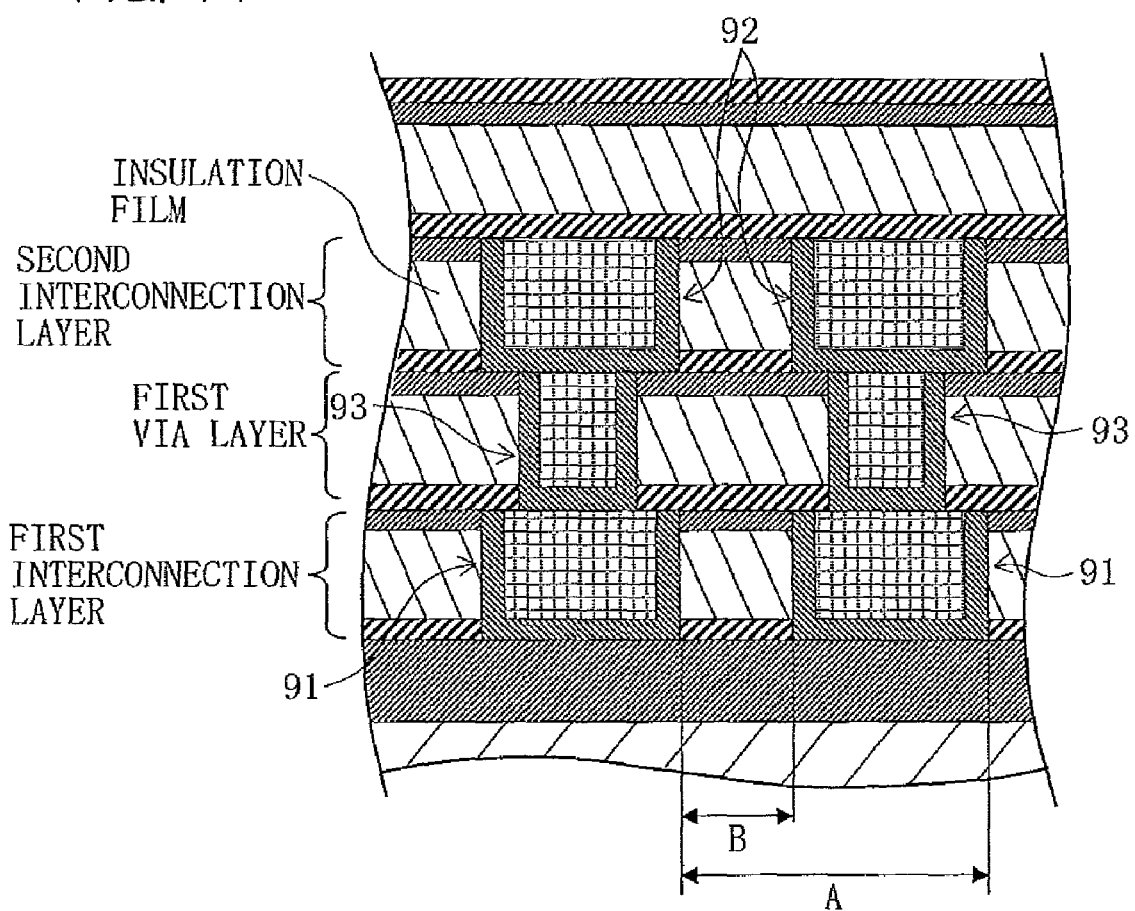

SEMICONDUCTOR DEVICE MANUFACTURING METHOD

CROSS-REFERENCE TO RELATED APPLICATIONS

This application is a divisional application of application Ser. No. 11/579,339, filed on Nov. 1, 2006, which is the US national phase of an international application claiming priority from Japanese Patent Application No. 2004-310735 filed with the Japanese Patent Office on Oct. 26, 2004, the disclosure of which is incorporated herein by reference.

TECHNICAL FIELD

The present invention relates to a semiconductor device production method and, particularly, a method for producing a semiconductor device including Cu (copper) interconnections.

BACKGROUND ART

For higher density integration and higher performance of semiconductor integrated circuits (LSI), micro-processing techniques have recently been developed. A CMP (chemical mechanical polishing) method is one of such techniques. This method is often utilized in an interlevel insulation film planarizing step, a metal plug forming step and a burying step in an LSI fabrication process, particularly in a multilevel interconnection forming process (see, for example, U.S. Pat. No. 4,944,836).

Particularly, a recent trend of a wiring technique is to employ Cu or a Cu alloy (hereinafter referred to collectively as "Cu") having a lower resistance instead of a conventionally used Al (aluminum) alloy to achieve higher performance of the LSIs. Cu has a lower resistivity (1.8 μΩcm) than the conventionally used Al-based alloy material. Further, the Al-based alloy typically has a melting point of 600° C., while Cu has a melting point of 1080° C. An electro-migration resistance and a stress-migration resistance have correlations with the melting point of the material. Therefore, Cu having a higher melting point is more reliable as an interconnection material than the Al-based alloy. In reality, the electro-migration resistance of Cu is higher by an order of magnitude than that of the aluminum-based alloy.

It is difficult to micro-process Cu by dry etching which is often used for formation of Al alloy interconnections. Therefore, a damascene method is employed in which Cu is deposited over an insulation film formed with a groove and a portion of the resulting Cu film formed outside the groove is removed by the CMP method to form a buried interconnection (see, for example, Japanese Unexamined Patent Publication No. HEI9 (1997)-45782 published by Japanese Patent Office).

The Cu film is typically formed by forming a thin seed layer by a sputtering method or the like and then depositing Cu to a thickness of about several hundreds of nanometers by an electrolytic plating method. For suppression of diffusion of Cu into the insulation film at this time, a thin underlying film of a high melting point metal or a compound of the high melting point metal is generally formed over the insulation film after the formation of the groove and a hole in the insulation film. This is followed by the formation of the Cu buried interconnection (or the filling with Cu). After the formation of the Cu buried interconnection, the bottom and side walls of the groove and the hole are covered with the thin film (the aforementioned underlying film) of the high melting point metal or the high melting point metal compound (so-called barrier metal), so that bottom and side surfaces of the Cu buried interconnection contact the barrier metal.

Recently, it has been contemplated to use a low-k film having a lower dielectric constant as an interlevel insulation film. That is, an attempt is made to reduce parasitic capacitance occurring between interconnections by using a low-k film having a dielectric constant k of not higher than 3.5, for example, instead of a silicon oxide ($SiO_2$) film having a dielectric constant k of about 4.2. Low-k film materials having a dielectric constant k of not higher than 2.5 are also under development. Most of these materials are porous materials having pores. A production method for a semiconductor device having a multilevel interconnection structure including such a low-k film (or a porous low-k film) and a Cu interconnection in combination is as follows.

FIGS. 10(a) to 10(e) are sectional views illustrating steps of the production method for the conventional semiconductor device having the multilevel interconnection structure including the low-k film and the Cu interconnection in combination. In FIGS. 10(a) to 10(e), a device forming step and the like are not shown.

As shown in FIG. 10(a), a first insulation film 221 is formed on a substrate 200 such as a silicon substrate by a CVD (chemical vapor deposition) method.

As shown in FIG. 10(b), a groove structure (an opening H) for formation of a Cu metal interconnection or a Cu contact plug is formed in the first insulation film 221 by a photolithography process and an etching process.

As shown in FIG. 10(c), a barrier metal film 240, a Cu seed film and a Cu film 260 are formed in this order over the first insulation film 221, and annealed at a temperature of 150° C. to 400° C. for about 30 minutes.

As shown in FIG. 10(d), a Cu interconnection is formed in the opening H (groove) by partly removing the Cu film 260 and the barrier metal film 240 by a CMP method.

As shown in FIG. 10(e), a silicon nitride film 277 is formed as a diffusion prevention film on a surface of the Cu film 260 and, if a multilevel Cu interconnection structure is to be formed, a second insulation film 281 is formed over the resulting substrate.

FIG. 11 is a sectional view of a semiconductor device having a multilevel interconnection structure.

Where the multilevel interconnection structure is formed as shown in FIG. 11, an independent first via layer having a via 93 for connecting a interconnection 91 of a first interconnection layer and an interconnection 92 of a second interconnection layer is provided between the first interconnection layer and the second interconnection layer. To provide a multilevel structure including a greater number of interconnection layers, the interconnection layers and via layers are alternately stacked.

Further, Japanese Unexamined Patent Publication (KOKAI) No. 9-45782 published by Japanese Patent Office discloses a technique for providing a fuse in a via layer for connection between interconnections provided in an overlying interconnection layer. A high melting point metal such as tungsten (W) or tantalum (Ta) or a silicide of the high melting point metal is used as a material for the fuse.

For higher density integration and higher speed operation of semiconductor devices, the interconnection structure is shifted from a single level structure to a multilevel structure. A semiconductor device having a metal interconnection structure including five or more interconnection layers has been developed and come into production. However, the higher density integration leads to a signal transmission delay attributable to so-called interconnect parasitic capacitance and interconnect resistance. The signal transmission delay attributable to the multilevel interconnection structure exerts significant influences on the higher speed operation of the semiconductor devices. In recent years, various measures against this problem have been taken.

In general, the signal transmission delay is expressed by a product of the interconnect parasitic capacitance and the interconnect resistance. For reduction of the interconnect resistance, the conventional Al interconnections are increasingly replaced with the lower resistance Cu interconnections. However, adjacent interconnections in each of the interconnection layers should be spaced a predetermined distance from each other, whether the interconnections be the Al interconnections or the Cu interconnections. As shown in FIG. 11, the interconnections should be formed at a minimum interconnection pitch A and spaced a distance B from each other. Therefore, even if a lower resistance material is employed in the conventional interconnection structure, the interconnections should be spaced a distance which is determined depending on the material. To provide the multilevel structure, the interconnection layers and the via layers should be alternately stacked, so that one via layer is required for each interconnection layer. Therefore, the total number of layers to be formed is double the number of the interconnection layers, making it difficult to increase the integration density.

DISCLOSURE OF THE INVENTION

It is therefore an object of the present invention to improve the interconnection integration density of a semiconductor device having a multilevel interconnection structure.

A semiconductor device according to the present invention comprises at least three interconnection layers sequentially stacked without intervention of a via layer, wherein at least one of the interconnection layers includes an interconnection and a via which connects interconnections provided in interconnection layers underlying and overlying the one interconnection layer.

An interconnection structure can be more flexibly formed by stacking interconnection layers each including an interconnection and a via into a multilevel structure without intervention of via layers. That is, the more flexible formation of the interconnection structure can be achieved without distinction between the interconnection layers and the via layers. With the more flexible formation of the interconnection structure, the integration density of the interconnections can be improved. Further, there is no need to provide an exclusive via layer between the interconnection layers.

The interconnection provided in the one interconnection layer preferably has the same thickness as the one interconnection layer. Since the interconnection and the interconnection layer have the same thickness, the interconnection can be properly connected to vias and/or interconnections provided in the underlying and overlying interconnection layers. In a production process, there is no need to stop an etching process for the formation of the interconnection, thereby improving the controllability of the etching process.

In the at least one interconnection layer, the interconnection and the via are preferably arranged at a pitch equivalent to an interconnection pitch which is defined between interconnections arranged alone in an interconnection layer. By arranging the interconnection and the via in the one interconnection layer at the pitch equivalent to the interconnection pitch, an interconnection pitch between the interconnection of the overlying or underlying layer connected to the via and the interconnection provided in combination with the via in the interconnection layer can be reduced. The reduction of the interconnection pitch increases the interconnection integration density. Where an edge of the via is located inward of a widthwise edge of the interconnection of the overlying or underlying layer connected to the via, for example, the via may have a smaller width or a greater width than the interconnection.

Alternatively, interconnections respectively provided in at least two adjacent interconnection layers of the at least three interconnection layers are arranged at a pitch equivalent to an interconnection pitch which is defined between interconnections arranged alone in an interconnection layer.

By arranging the interconnections respectively provided in the at least two adjacent interconnection layers at the pitch equivalent to the interconnection pitch, a distance between the interconnections of the adjacent interconnection layers can be increased. The increase of the distance between the interconnections reduces the parasitic capacitance between the interconnections.

A semiconductor device production method according to the present invention comprises the steps of: forming an insulation film on a substrate; forming an interconnection opening and a via opening in the insulation film, the interconnection opening and the via opening each extending through the insulation film; and depositing an electrically conductive material in the interconnection opening and the via opening.

The interconnection opening and the via opening are formed in the insulation film as extending through the insulation film and the electrically conductive material is deposited in the interconnection opening and the via opening, whereby the interconnection and the via can be provided in combination in the insulation film. The provision of the interconnection and the via in combination permits more flexible formation of the interconnection structure.

In the insulation film forming step, it is particularly effective to form a low dielectric constant material film having a dielectric constant of not higher than 3.5 as the insulation film for the higher density integration.

In the depositing step, it is particularly effective to employ copper (Cu) as the electrically conductive material for the higher density integration.

The foregoing and other objects, features and effects of the present invention will become more apparent from the following description of embodiments with reference to the attached drawings.

BRIEF DESCRIPTION OF THE DRAWINGS

FIGS. 5(a) to 5(d) are sectional views for explaining steps from a planarizing step in the first interconnection layer forming process to a $SiO_2$ film forming step in a second interconnection layer forming process shown in FIG. 2;

FIGS. 7(a) to 7(c) are sectional views for explaining steps from a plating step in the second interconnection layer forming process shown in FIG. 2 to a low-k film forming step for a third interconnection layer;

FIGS. 8(a) and 8(b) are sectional views of semiconductor devices in which interconnections and vias are arranged at a minimum interconnection pitch;

FIGS. 9(a) and 9(b) are sectional views of semiconductor devices in which vertically adjacent interconnections are arranged at a minimum interconnection pitch;

FIG. 11 is a sectional view of a semiconductor device having a multilevel interconnection structure.

BEST MODE FOR IMPLEMENTING THE INVENTION

Figure 1:
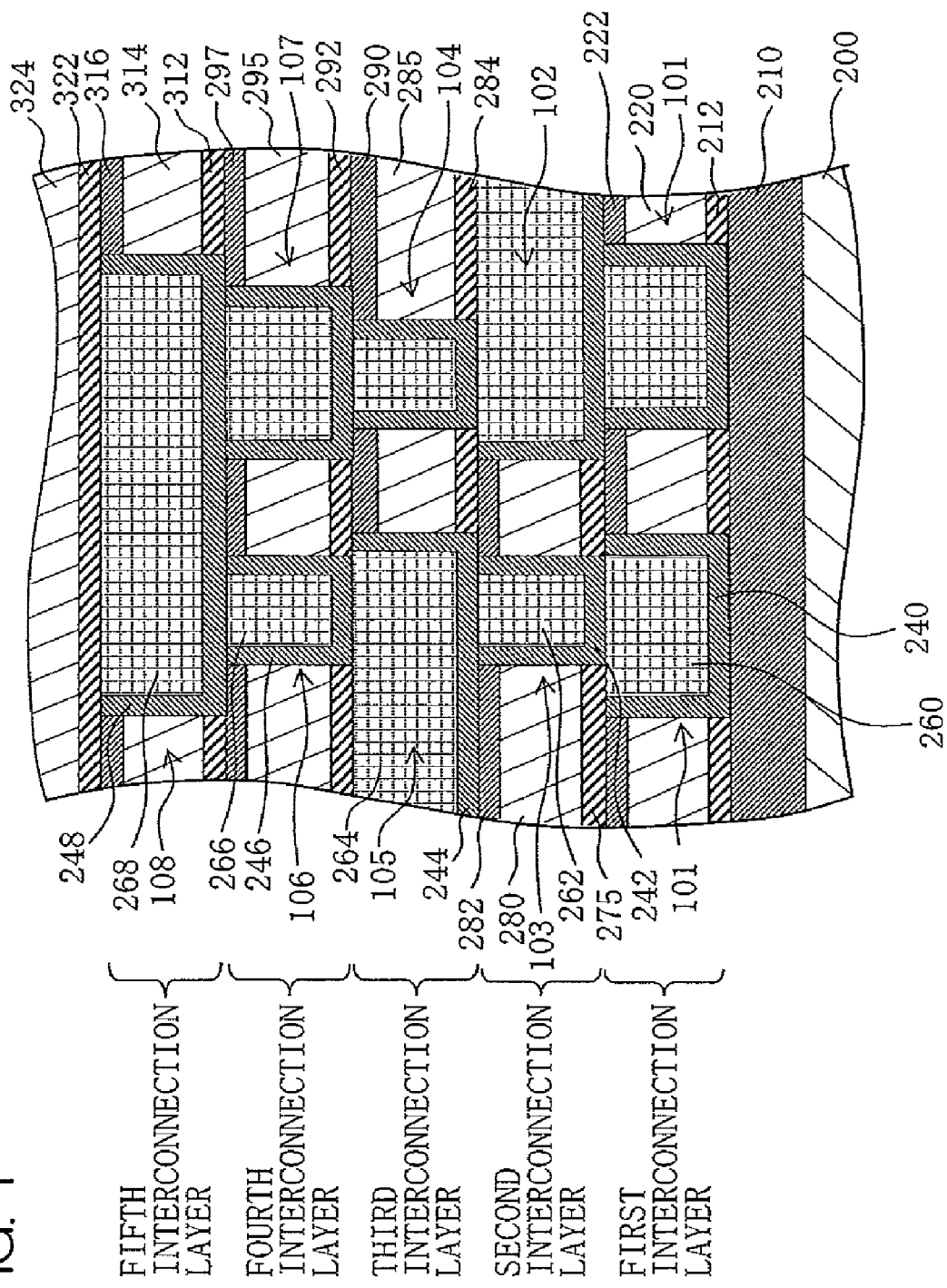
FIG. 1 is a sectional view of a semiconductor device according to a first embodiment of the present invention.

FIG. 1 is a sectional view of a semiconductor device according to a first embodiment of the present invention.

As shown in FIG. 1, the semiconductor device includes a $SiO_2$ film 210 provided on a substrate 200, and a first interconnection layer, a second interconnection layer, a third interconnection layer, a fourth interconnection layer and a fifth interconnection layer stacked in this order on the $SiO_2$ film 210. Although the semiconductor device includes the first to fifth interconnection layers in this embodiment, the semiconductor device may include a greater number of interconnection layers to provide a multilevel structure.

The first interconnection layer includes a first insulation film which includes an underlying SiC film 212, a low-k film 220 provided on the SiC film 212, and a $SiO_2$ film 222 as a cap film. The first interconnection layer further includes Cu films 260 as interconnections 101, and barrier metal films 240 respectively provided in contact with side and bottom surfaces of the Cu films 260 defined as the Cu interconnections. The first interconnection layer has no via, but this arrangement is not limitative.

The second interconnection layer includes a second insulation film which includes an underlying SiC film 275, a low-k film 280 provided on the SiC film 275, and a $SiO_2$ film 282 as a cap film. The second interconnection layer further includes Cu films 262 respectively provided as an interconnection 102 and a via 103 in combination, and barrier metal films 242 respectively provided in contact with side and bottom surfaces of the Cu films 262. The interconnection 102 is connected to one of the interconnections 101 of the first interconnection layer and a via 104 of the third interconnection layer. The via 103 is connected to the other interconnection 101 of the first interconnection layer and an interconnection 105 of the third interconnection layer.

The third interconnection layer includes a third insulation film which includes an underlying SiC film 284, a low-k film 285 provided on the SiC film 284, and a $SiO_2$ film 290 as a cap film. The third interconnection layer further includes Cu films 264 respectively provided as the interconnection 105 and the via 104 in combination, and barrier metal films 244 respectively provided in contact with side and bottom surfaces of the Cu films 264. The interconnection 105 is connected to the via 103 of the second interconnection layer and a via 106 of the fourth interconnection layer. The via 104 is connected to the interconnection 102 of the second interconnection layer and an interconnection 107 of the fourth interconnection layer.

The fourth interconnection layer includes a fourth insulation film which includes an underlying SiC film 292, a low-k film 295 provided on the SiC film 292, and a $SiO_2$ film 297 as a cap film. The fourth interconnection layer further includes Cu films 266 respectively provided as the interconnection 107 and the via 106 in combination, and barrier met al films 246 respectively provided in contact with side and bottom surfaces of the Cu films 266 provided as the Cu interconnection and the Cu via. The interconnection 107 is connected to the via 104 of the third interconnection layer and an interconnection 108 of the fifth interconnection layer. The via 106 is connected to the interconnection 105 of the third interconnection layer and the interconnection 108 of the fifth interconnection layer.

The fifth interconnection layer includes a fifth insulation film which includes an underlying SiC film 312, a low-k film 314 provided on the SiC film 312, and a $SiO_2$ film 316 as a cap film. The fifth interconnection layer further includes a Cu film 268 as the interconnection 108, and a barrier metal film 248 provided in contact with side and bottom surfaces of the Cu film 268 provided as the Cu interconnection.

On the fifth interconnection layer, a sixth insulation film is provided which includes an underlying SiC film 322 and a low-k film 324 provided on the SiC film 322.

As described above, the interconnection layers each including both the interconnection and the via are stacked one on another without the intervention of a via layer to form the multilevel structure, whereby the interconnection structure can be more flexibly designed. Further, this obviates the need for providing an exclusive via layer between the interconnection layers. This arrangement is particularly effective where the multilevel interconnection structure includes three or more interconnection layers each including an interconnection and a via in combination. Unlike the prior art, the interconnection provided in combination with the via in each of the interconnection layers does not serve as a fuse, which is melt down by irradiation with a laser after fabrication of a chip. Hence, there is no problem even if the interconnection provided in combination with the via in the interconnection layer is overlapped with an interconnection and/or a via provided in an overlying interconnection layer as seen from the top of the chip. In other words, the interconnection provided in combination with the via in the interconnection layer can be employed to form any desired interconnection structure regardless of an interconnection length and connection with the overlying or underlying layer.

The semiconductor device according to the present invention is not limited to the layout shown in FIG. 1, but is merely required to have a multilevel structure in which a plurality of interconnection layers each including both an interconnection and a via are stacked one on another without the intervention of a via layer including no interconnection but vias alone. The multilevel structure is formed by stacking the interconnection layers each including an interconnection and a via in combination without the intervention of the via layer, whereby the interconnection structure can be more flexibly designed. Further, there is no need to provide the exclusive via layer between the interconnection layers.

The interconnections each have the same thickness as the corresponding interconnection layer. By forming the interconnection having the same thickness as the corresponding interconnection layer, the interconnection can be connected to a via or an interconnection provided in an overlying or underlying layer. Further, there is no need to stop an etching process for formation of the interconnection in the production process, thereby improving the controllability of the etching process. This improves the accuracy of the etching.

Major steps of a method for forming the first interconnection layer and the second interconnection layer will hereinafter be described with reference to the drawings.

Figure 2:
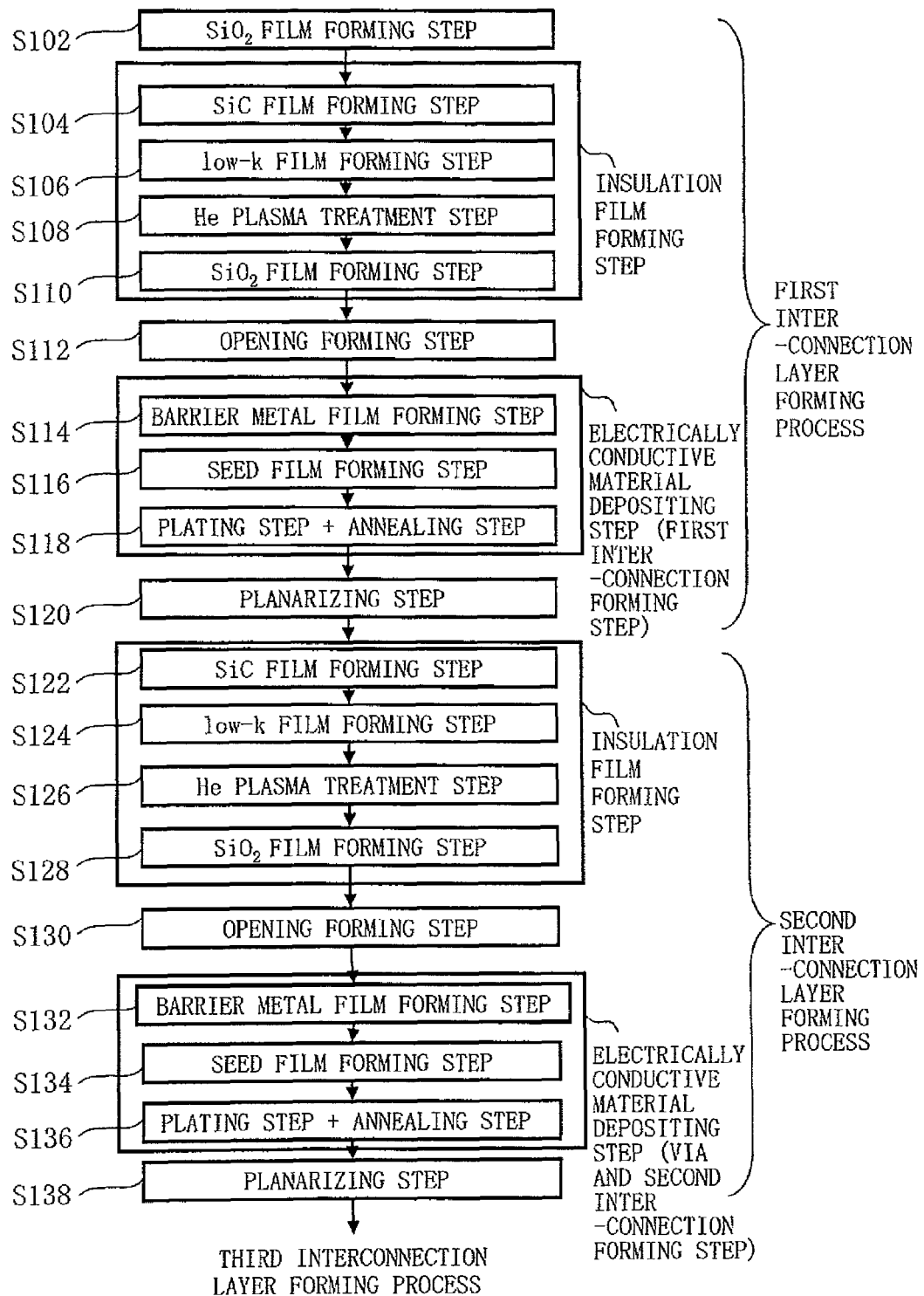
FIG. 2 is a flow chart illustrating major steps of a production method for the semiconductor device of FIG. 1.

FIG. 2 is a flow chart illustrating the major steps of the production method for the semiconductor device of FIG. 1.

For formation of the first interconnection layer and the second interconnection layer, a $SiO_2$ film forming step for forming a $SiO_2$ film 210 (S102), an insulation film forming step for the first interconnection layer, an opening forming step for forming openings (S112), an electrically conductive material depositing step for depositing an electrically conductive material (first interconnection forming step), a planarizing step (S120), an insulation film forming step for the second interconnection layer, an opening forming step for forming openings (S130), an electrically conductive material depositing step for depositing an electrically conductive material (via and second interconnection forming step) and a planarizing step (S138) are sequentially performed.

In the insulation film forming step for the first interconnection layer, a SiC film forming step for forming a SiC film 212 (S104), a low-k film forming step for forming a low-k film 220 of a porous insulative material (S106), a helium (He) plasma treatment step for plasma-treating a surface of the low-k film 220 (S108) and a $SiO_2$ film forming step for forming a $SiO_2$ film 222 (S110) are performed.

In the electrically conductive material depositing step in the first interconnection layer forming process, a barrier metal film forming step (S114), a seed film forming step (S116) and a plating step (S118) are performed.

In the insulation film forming step for the second interconnection layer, a SiC film forming step for forming a SiC film 275 (S122), a low-k film forming step for forming a low-k film 280 of a porous insulative material (S124), a helium (He) plasma treatment step for plasma-treating a surface of the low-k film 280 (S126) and a $SiO_2$ film forming step for forming a $SiO_2$ film 282 (S128) are performed.

In the electrically conductive material depositing step in the second interconnection layer forming process, a barrier metal film forming step (S132), a seed film forming step (S134) and a plating step (S136) are performed.

FIGS. 3(a) to 3(d) are sectional views for explaining steps from the $SiO_2$ film forming step (S102) to the $SiO_2$ film forming step (S110) for forming the $SiO_2$ film on the low-k film.

Figure 3A:
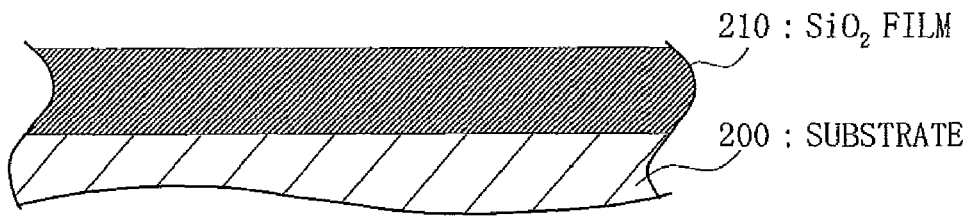
FIGS. 3(a) to 3(d) are sectional views for explaining steps from a $SiO_2$ film forming step to another $SiO_2$ film forming step in a first interconnection layer forming process shown in FIG. 2.

In the $SiO_2$ film forming step (S102), as shown in FIG. 3(a), a $SiO_2$ film 210 having a thickness of 200 nm, for example, is formed on a substrate 200 by a CVD method. The formation of the $SiO_2$ film is herein achieved by the CVD method, but may be achieved by any other method. A silicon wafer or the like having a diameter of 300 mm, for example, is used as the substrate 200. In FIGS. 3(a) to 3(d), a device forming step and the like are not shown. A layer having a device portion such as a contact plug may be formed instead of the $SiO_2$ film 210. Alternatively, any other type of layer may be formed. The substrate 200 may be formed with a layer having a device portion such as a contact plug or any other type of layer.

Figure 3B:
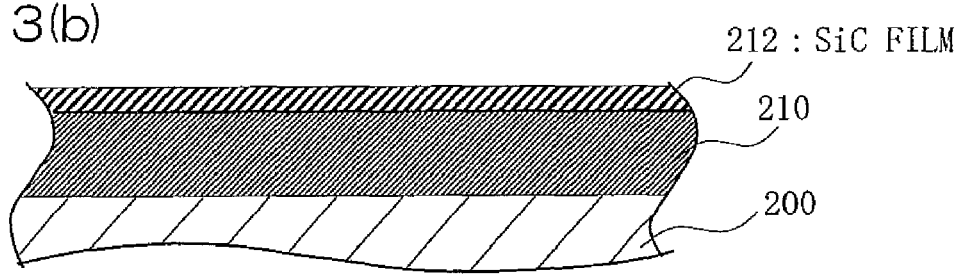

In the SiC film forming step (S104), as shown in FIG. 3(b), a SiC film 212 having a thickness of 30 nm, for example, is formed on the $SiO_2$ film 210 by a CVD method. The formation of the SiC film 212 is herein achieved by a CVD method, but may be achieved by any other method. The SiC film 212 also functions as an etching stopper. Since the formation of the SiC film is difficult, a SiOC film may be used instead of the SiC film. Alternatively, a SiCN film or a SiN film may be used.

Figure 3C:
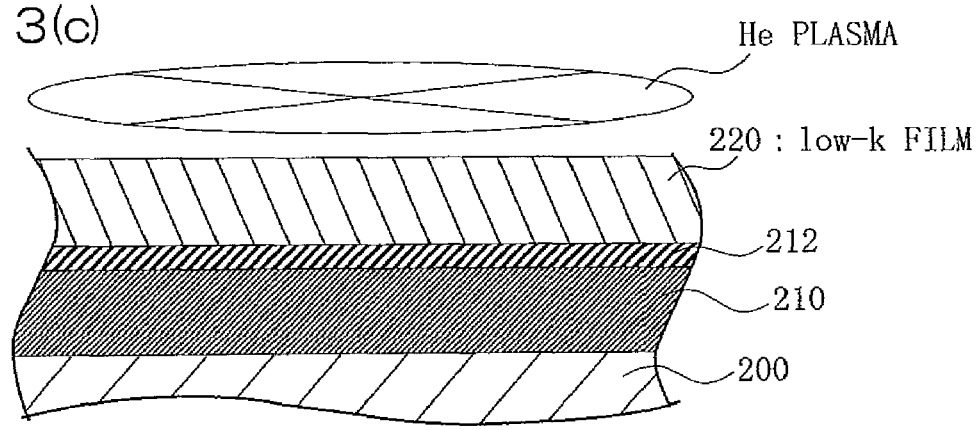

In the low-k film forming step (S106), as shown in FIG. 3(c), a low-k film 220 of a porous insulative material having a thickness of 200 nm, for example, is formed on the SiC film 212. The formation of the low-k film 220 allows the interlevel insulation film to have a dielectric constant of lower than 3.5. A porous MSQ (methyl silsequioxane), for example, is used as a material for the low-k film 220. The formation of the low-k film may be achieved, for example, by an SOD (spin on dielectric coating) method which is adapted to form a thin film by applying a material solution by spin-coating and heat-treating the solution. In this embodiment, the rotation speed of a spinner is, for example, 900 $min^{-1}$ (900 rpm). The wafer is placed on a hot plate, and baked at a temperature of 250° C. in a nitrogen atmosphere and finally at a temperature of 450° C. in the nitrogen atmosphere for 10 minutes for curing the MSQ. By properly selecting an MSQ material and properly adjusting the conditions for the film formation, the porous insulation film can be provided as having predetermined levels of physical properties. For example, the low-k film 220 has a density of 0.7 $g/cm^3$ and a dielectric constant k of 1.8. The percentages of Si, O and C in the low-k film 220 are 25 to 35%, 45 to 57% and 13 to 24%, respectively.

In the He plasma treatment step (S108), the surface of the low-k film 220 is modified in a CVD apparatus by irradiation with helium (He) plasma. By modifying the surface by the irradiation with the He plasma, adhesion between the low-k film 220 and a CVD-$SiO_2$ film 222 to be formed as the cap film on the low-k film 220 can be improved. The He plasma treatment may be performed under the following conditions: a gas flow rate of 1.7 $Pa·m^3/s$ (1000 sccm); a gas pressure of 1000 Pa; a high frequency power of 500 W; a low frequency power of 400 W; and a temperature of 400° C. When the cap film (CVD-$SiO_2$ film 222) is formed on the low-k film 220, the plasma treatment of the surface of the low-k film 220 is effective for the improvement of the adhesion between the cap film and the low-k film. Exemplary plasma gases include ammonia ($NH_3$), dinitrogen monoxide ($N_2O$), hydrogen ($H_2$), He, oxygen ($O_2$), silane ($SiH_4$), argon (Ar) and nitrogen ($N_2$), among which the He plasma gas is particularly effective because damage to the low-k film is minimum. A plasma gas to be herein used may be a mixture of any of these gases. For example, use of a mixture of the He gas and another of these gases is effective.

Figure 3D:
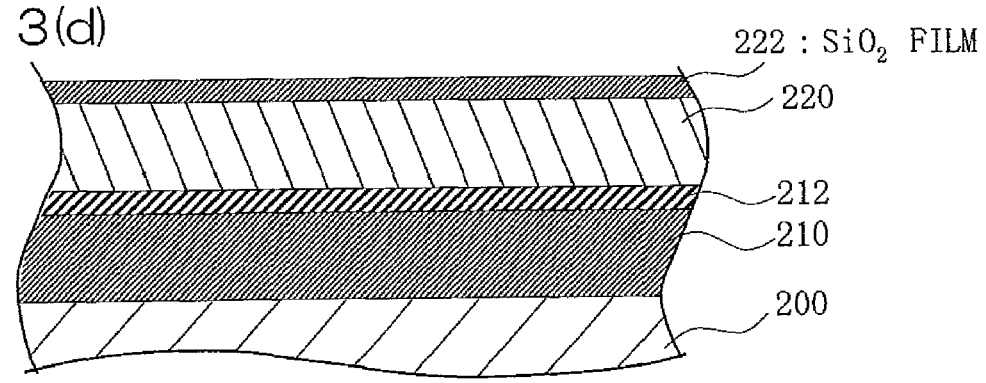

In the $SiO_2$ film forming step (S110), as shown in FIG. 3(d), $SiO_2$ is deposited to a thickness of 50 nm, for example, on the low-k film 220 by a CVD method to form a $SiO_2$ film 222 as the cap film after the He plasma treatment. The formation of the $SiO_2$ film 222 makes it possible to protect the low-k film 220 which cannot be directly processed by a lithography method for patterning of the low-k film 220. Examples of the cap film include a $SiO_2$ film, a SiC film, a SiOC film and a SiCN film. The $SiO_2$ film is excellent for reduction of the damage, and the SiOC film is excellent for reduction of the dielectric constant. Further, the SiC film and the SiCN film are excellent for improvement of breakdown voltage. Alternatively, a laminate film of the $SiO_2$ film and the SiC film, a laminate film of the $SiO_2$ film and the SiCO film or a laminate film of the $SiO_2$ film and the SiCN film may be used. Further, the cap film may be partly or entirely removed by a CMP method in the planarizing step to be described later. The removal of the cap film further reduces the dielectric constant. The cap film preferably has a thickness of 10 nm to 150 nm, more preferably 10 nm to 50 nm, for effective reduction of the dielectric constant.

The interlevel insulation film in the underlying interconnection layer is not necessarily required to include the low-k film having a dielectric constant of not higher than 3.5, but the provision of the low-k film is particularly effective. The provision of the low-k film reduces the parasitic capacitance between the interconnections, thereby achieving a higher integration density.

FIGS. 4(a) to 4(d) are sectional views for explaining steps from the opening forming step (S112) to the plating step (S118).

Figure 4A:
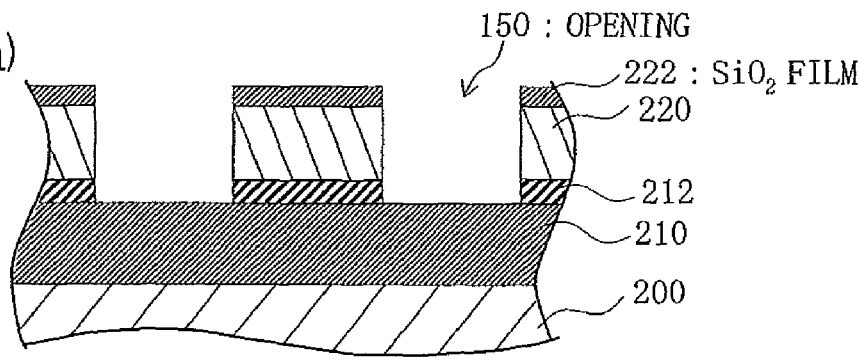
FIGS. 4(a) to 4(d) are sectional views for explaining steps from an opening forming step to a plating step in the first interconnection layer forming process shown in FIG. 2.

In the opening forming step (S112), as shown in FIG. 4(a), openings 150 are formed in the $SiO_2$ film 222, the low-k film 220 and the SiC film 212 by a lithography process and a dry etching process to form an interconnection groove structure for formation of damascene interconnections. More specifically, the formation of the openings 150 is achieved by forming a resist film on the $SiO_2$ film 222 through a resist applying step and an exposure step in the lithography process, then removing portions of the $SiO_2$ film 222 exposed from the resist film and portions of the low-k film 220 underlying the exposed portions by an anisotropic etching process with the use of the SiC film 212 as an etching stopper, and etching away portions of the SiC film 212. The anisotropic etching process makes it possible to form the openings 150 generally perpendicularly to the surface of the substrate 200. An exemplary anisotropic etching method for the formation of the openings 150 is a reactive ion etching method.

Figure 4B:
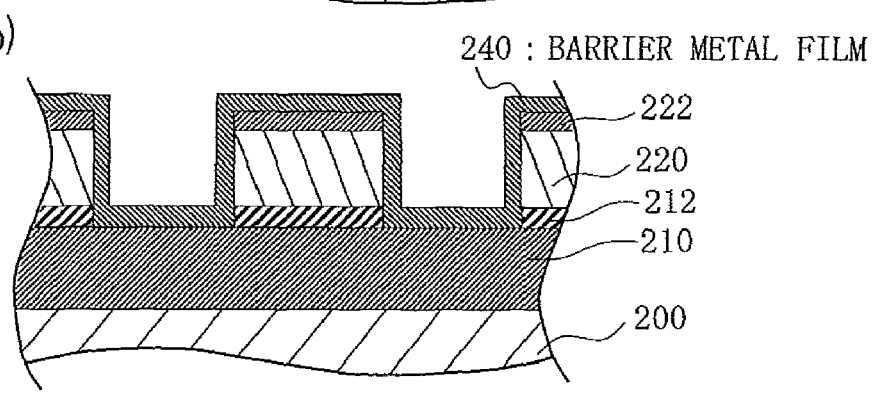

In the barrier metal film forming step (S114), as shown in FIG. 4(b), a barrier metal film 240 of a barrier metal material is formed on a surface of the $SiO_2$ film 222 and in the openings 150 formed in the opening forming step (S112). The formation of the barrier metal film 240 is achieved by depositing tantalum nitride (TaN) and tantalum (Ta) to form a laminate film of a TaN film and a Ta film having a total thickness of 13 nm, for example, in a sputtering apparatus by a sputtering method which is one of PVD (physical vapor deposition) methods. With the provision of the laminate film of the TaN film and the Ta film, the TaN film prevents diffusion of Cu into the low-k film 220, and the Ta film improves adhesion to Cu. Instead of the PVD method, an atomic layer vapor deposition method (an atomic layer deposition (ALD) method or an atomic layer chemical vapor deposition (ALCVD) method) or a CVD method, for example, may be employed for the deposition of the barrier metal materials. These methods improve the coverage as compared with the PVD method.

Figure 4C:
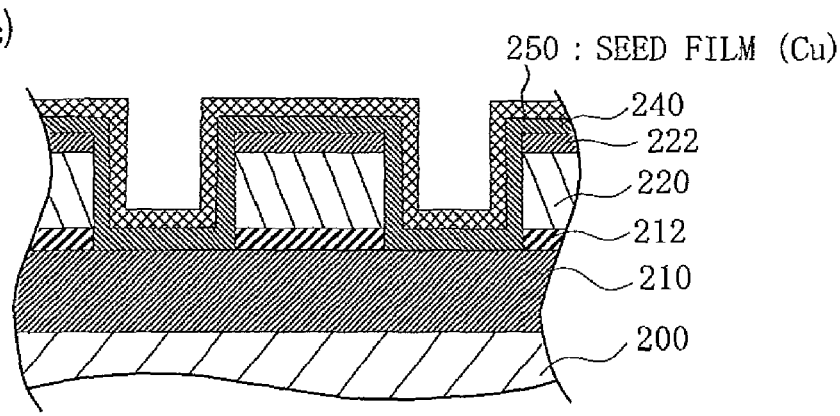

In the seed film forming step (S116), as shown in FIG. 4(c), Cu is deposited on the interiors of the openings 150 and the surface of the resulting substrate 200 formed with the barrier metal film 240 by a physical vapor deposition (PVD) method such as sputtering to form a Cu thin film as a seed film 250 which serves as a cathode in the following electrolytic plating step (S118). Here, the seed film 250 has, for example, a thickness of 75 nm.

Figure 4D:
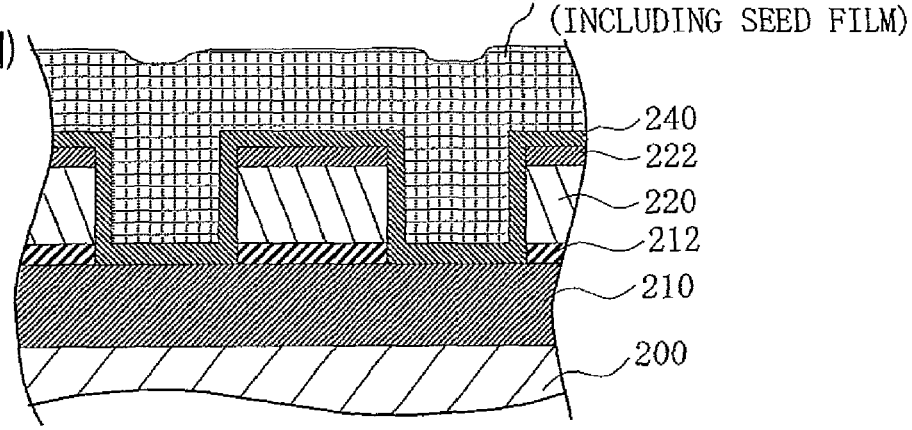

In the plating step (S118), as shown in FIG. 4(d), Cu is further deposited on the interiors of the openings 150 and the surface of the resulting substrate 200 to form a Cu film 260 by an electrochemical deposition method such as electrolytic plating with the use of the seed film 250 as the cathode. Here, the Cu film 260 has, for example, a thickness of 300 nm. Thereafter, an annealing process is performed at a temperature of 250° C. for 30 minutes.

FIGS. 5(a) to 5(d) are sectional views for explaining steps from the planarizing step (S120) to the $SiO_2$ film forming step (S128) in the second interconnection forming process.

In the planarizing step (S120), as shown in FIG. 5(a), portions of the Cu film 260, the seed film 250 and the barrier metal film 240 formed on the surface of the $SiO_2$ film 222 are polished away by a CMP method to form a buried structure. In this embodiment, a CMP apparatus to be herein used is of an orbital type. Novellus System's Momentum 300, for example, is used as the orbital type CMP apparatus. The CMP process is performed, for example, with the use of a foamed polyurethane single layer pad (Rodel's IC1000) as a polisher pad under the following conditions: a CMP load of $1.03 \times 10^4$ Pa (1.5 psi); an orbital rotation speed of 600 $min^{-1}$ (600 rpm); a head rotation speed of 24 $min^{-1}$ (24 rpm); and a slurry supply rate of 0.3 L/min (300 cc/min). Further, an abrasive-free slurry (Hitachi Chemical's HS-C430-TU) is used as a CMP slurry for Cu, and a colloidal silica abrasive slurry (Hitachi Chemical's HS-T605-8) is used as a CMP slurry for the barrier metal. The portions of the Cu film and the barrier metal film formed outside the grooves are removed by performing the CMP under the aforesaid conditions, whereby damascene Cu interconnections are formed.

Subsequently, the second interconnection layer is formed as overlying the first interconnection layer.

In the SiC film forming step (S122), as shown in FIG. 5(b), a SiC film 275 having a thickness of 30 nm, for example, is formed on the first interconnection layer in the same manner as described with reference to FIG. 3(b) by the CVD method. The formation of the SiC film 275 is herein achieved by the CVD method, but may be achieved by any other method. The SiC film 275 functions as a Cu diffusion preventing film. The SiC film 275 also functions as an etching stopper. Since the formation of the SiC film is difficult, a SiOC film may be used instead of the SiC film. Alternatively, a SiCN film or a SiN film may be used.

In the low-k film forming step (S124), as shown in FIG. 5(c), a low-k film 280 of a porous insulative material having a thickness of 200 nm, for example, is formed on the SiC film 275. This step is performed in the same manner as described with reference to FIG. 3(c) and, therefore, no specific explanation will be given to this step.

In the He plasma treatment step (S126), the surface of the low-k film 280 is modified in the CVD apparatus by irradiation with helium (He) plasma. This step is performed in the same manner as described with reference to FIG. 3(c) and, therefore, no specific explanation will be given to this step.

In the $SiO_2$ film forming step (S128), as shown in FIG. 5(d), $SiO_2$ is deposited to a thickness of 50 nm, for example, on the low-k film 280 by a CVD method to form a $SiO_2$ film 282 as a cap film after the He plasma treatment (S126). This step is performed in the same manner as described with reference to FIG. 3(d) and, therefore, no specific explanation will be given to this step.

Figure 6A:
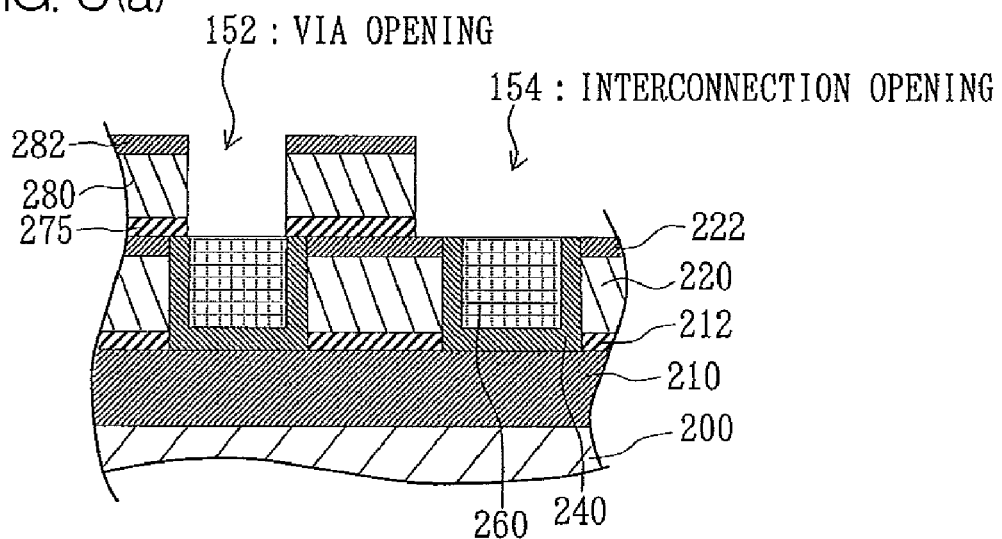
FIGS. 6(a) to 6(c) are sectional views for explaining steps from an opening forming step to a seed film forming step in the second interconnection layer forming process shown in FIG. 2.
Figure 6B:
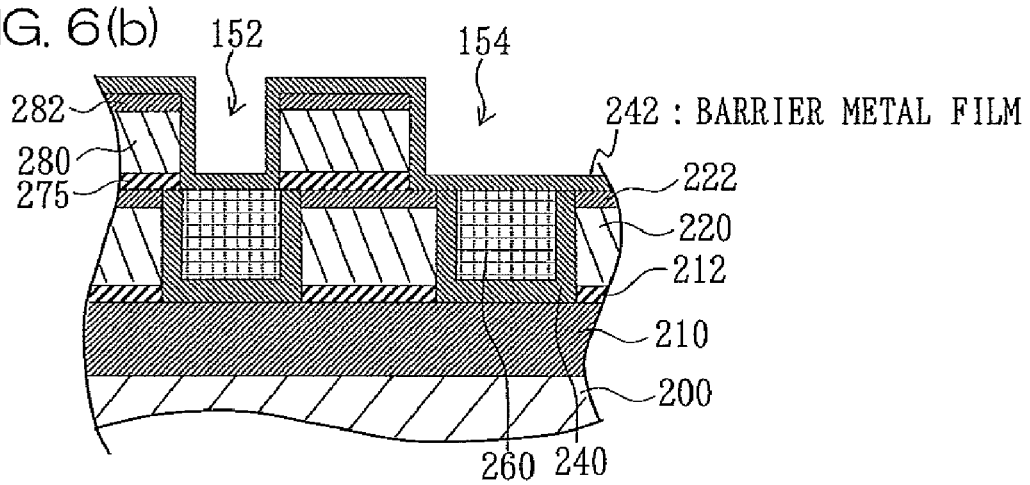
Figure 6C:
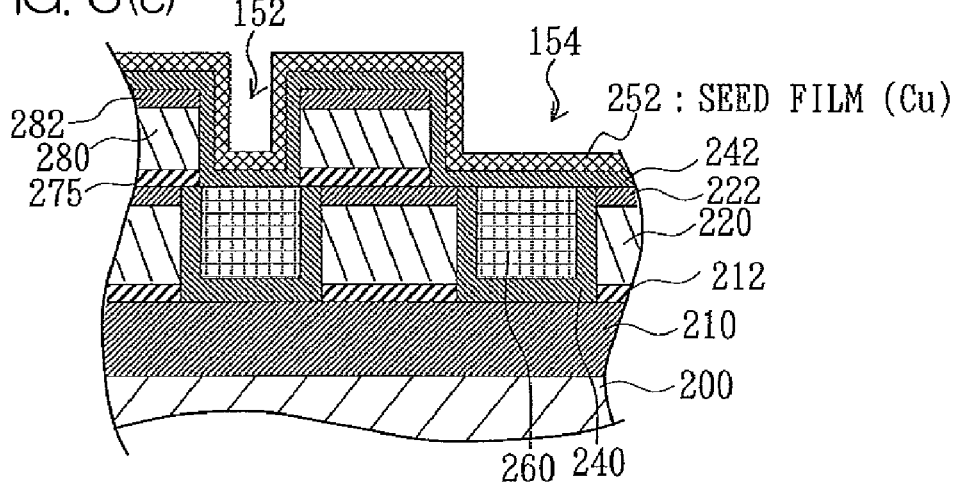
Figure 10A:
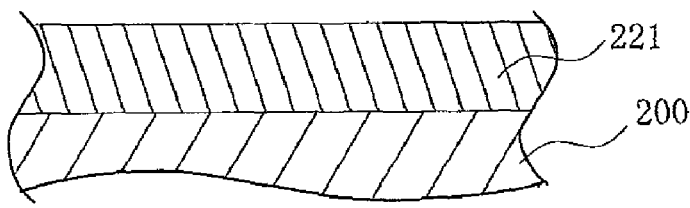
FIGS. 10(a) to 10(e) are sectional views illustrating steps of a production method for a conventional semiconductor device having a multilevel interconnection structure including a low-k film and a Cu interconnection in combination.
Figure 10B:
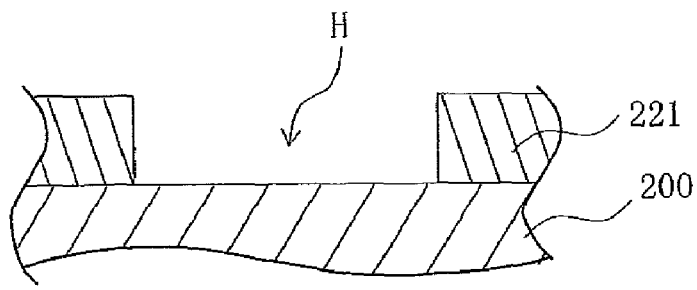
Figure 10C:
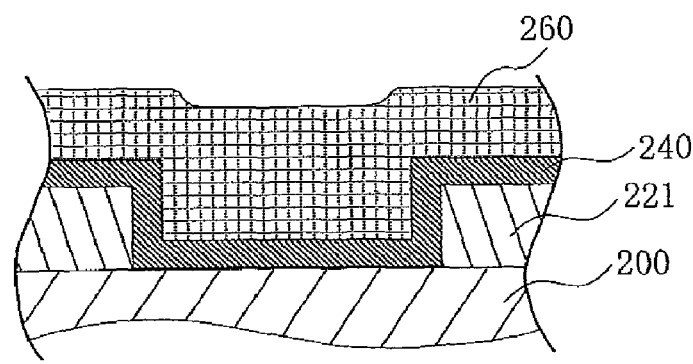
Figure 10D:
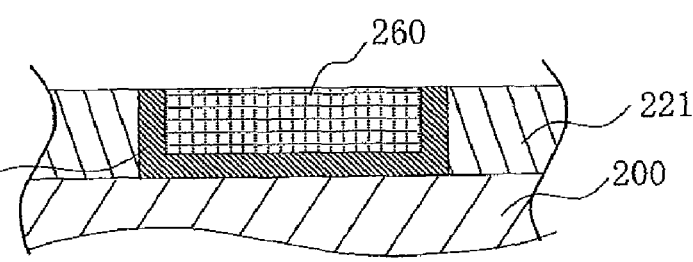
Figure 10E:
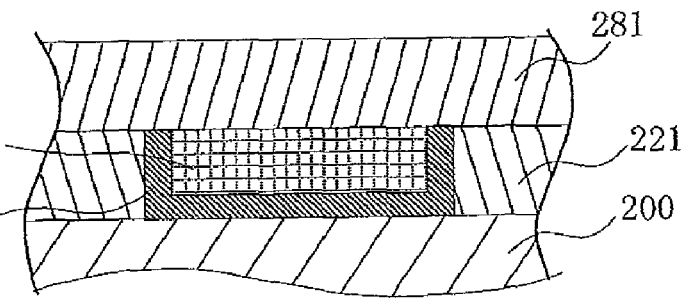

FIGS. 6(a) to 6(c) are sectional views for explaining steps from the opening forming step (S130) to the seed film forming step (S134) in the second interconnection layer forming process.

In the opening forming step (S130), as shown in FIG. 6(a), an opening 154 defined as an interconnection groove structure for formation of a damascene interconnection and an opening 152 defined as a via hole structure are formed in the $SiO_2$ film 282, the low-k film 280 and the SiC film 275 by a lithography process and a dry etching process. The opening 154 and the opening 152 extend through the $SiO_2$ film 282, the low-k film 280 and the SiC film 275, and each have a depth which is equal to the total thickness of the $SiO_2$ film 282, the low-k film 280 and the SiC film 275. The etching depth can be adjusted by the provision of the SiC film 275 serving as the etching stopper, so that the interconnection groove and the via hole having different sizes (different widths) can be easily formed. This step is performed in the same manner as described with reference to FIG. 4(a) and, therefore, no specific explanation will be given to this step.

In the barrier metal film forming step (S132), as shown in FIG. 6(b), a barrier metal film 242 of a barrier metal material is formed in the opening 152 and the opening 154 and on a surface of the SiO$_2$ film 282. This step is performed in the same manner as described with reference to FIG. 4(b) and, therefore, no specific explanation will be given to this step.

In the seed film forming step (S134), as shown in FIG. 6(c), Cu is deposited on interior walls and bottom surfaces of the opening 152 and the opening 154 and the surface of the resulting substrate 200 formed with the barrier metal film 242 by a physical vapor deposition (PVD) method such as sputtering to form a Cu thin film as a seed film 252 which serves as a cathode in the following electrolytic plating step. This step is performed in the same manner as described with reference to FIG. 4(c) and, therefore, no specific explanation will be given to this step.

FIGS. 7(a) to 7(c) are sectional views for explaining steps from the plating step (S136) in the second interconnection layer forming process to a low-k film forming step for the third interconnection layer.

In the plating step (S136), as shown in FIG. 7(a), Cu is further deposited in the opening 152 and the opening 154 and on the surface of the resulting substrate 200 to form a Cu film 262 by an electrochemical deposition method such as electrolytic plating with the use of the seed film 252 as a cathode. This step is performed in the same manner as described with reference to FIG. 4(d) and, therefore, no specific explanation will be given to this step. Here, the via hole having a smaller diameter and the interconnection groove having a greater width and length are simultaneously filled with Cu. The plating process is first performed under conditions which prevents formation of a void in the via hole and, after the filling of the via hole, the plating electric current is increased. Thus, the smaller diameter via hole and the greater width/length interconnection groove are effectively simultaneously filled with Cu.

In the planarizing step (S138), as shown in FIG. 7(b), portions of the Cu film 262, the seed film 252 and the barrier metal film 242 formed on the surface of the SiO$_2$ film 282 are polished away by a CMP method to form a buried structure. This step is performed in the same manner as described with reference to FIG. 5(a) and, therefore, no specific explanation will be given to this step.

Subsequently, the third interconnection layer is formed as overlying the second interconnection layer.

As shown in FIG. 7(c), a SiC film 284 having a thickness of 30 nm, for example, is formed on the second interconnection layer in the same manner as described with reference to FIG. 3(b) by a CVD method. Then, a low-k film 285 of a porous insulative material is formed on the SiC film 284. Thereafter, the steps described above are repeated to form the interconnection layers, whereby the multilevel interconnection structure is provided. In the formation of each of the interconnection layers, the via and the interconnection are laid out in a desired manner.

FIGS. 8(a) and 8(b) are sectional views of semiconductor devices in which interconnections and vias are arranged at a minimum interconnection pitch.

A case where an interconnection and a via provided in at least one of the interconnection layers (e.g., the interconnection 105 and the via 104 in the third interconnection layer) are arranged at a pitch equivalent to a minimum interconnection pitch A (which is defined between interconnections arranged alone in an interconnection layer) as shown in FIG. 8(b) is compared with a conventional case where an interconnection and a via are provided in completely different layers as shown in FIG. 8(a). In the former case, a pitch A' between an interconnection of an overlying or underlying layer connected to the via 104 (e.g., the interconnection 107) and the interconnection 105 provided in combination with the via 104 in the third interconnection layer is smaller than the minimum interconnection pitch A, even if the interconnection 105 and the via 104 are arranged at a conventional minimum interconnection pitch A. Since the interconnection pitch is reduced, the interconnection density can be improved. As a result, the interconnection integration density can be increased. That is, the reduction of the interconnection pitch increases the interconnection integration density. In FIG. 8(b), the interconnections are arranged in staggered relation in the respective interconnection layers, so that the interconnection pitch A' of the vertically adjacent interconnections can be reduced to smaller than the minimum interconnection pitch A.

FIGS. 9(a) and 9(b) are sectional views of semiconductor devices in which the vertically adjacent interconnections are arranged at a minimum interconnection pitch.

A case where adjacent interconnections provided in at least two vertically adjacent interconnection layers (e.g., the interconnection 104 and the interconnection 107) are arranged at a pitch equivalent to a minimum interconnection pitch A (which is defined between interconnections arranged alone in an interconnection layer) as shown in FIG. 9(b) is compared with a conventional case where an interconnection and a via are provided in completely different layers as shown in FIG. 9(a). In the former case, a minimum interconnection distance X' between the interconnection 104 and the interconnection 107 is greater than a conventional minimum interconnection distance X. The minimum interconnection distance X' is increased to greater than the conventional minimum interconnection distance X, so that parasitic capacitance C occurring between opposed surfaces of the interconnections can be reduced. In FIG. 9(b), the adjacent interconnections are arranged in staggered relation in the respective layers, so that the minimum interconnection distance X' between the vertically adjacent interconnections can be increased to greater than the conventional minimum interconnection distance X.

In the embodiments described above, where the low-k film has a dielectric constant of not higher than 2.6, the side walls of the low-k film is preferably covered with a CVD film having a thickness of not greater than 20 nm. This is because the low-k film having a dielectric constant of not higher than 2.6 is often porous and required to be pore-sealed with side walls of the Cu interconnections. The formation of the barrier metal film by the ALD method or the CVD method as described above is particularly effective. Preferred examples of the CVD film for the pore sealing include a SiC film, a SiCN film, a SiCO film and a SiN film, among which the SiC film is particularly suitable for the reduction of the dielectric constant.

As the interconnection pitch is reduced, further increase of the integration density becomes more difficult. Therefore, with a reduced interconnection pitch, the aforesaid embodiments are more effective.

The barrier metal materials are not limited to Ta and TaN, but other examples of the barrier metal materials include nitrides of high melting point metals such as TaCN (tantalum carbide nitride), WN (tungsten nitride), WCN (tungsten carbide nitride) and TiN (titanium nitride). Further, Ti, WSiN and the like are also usable as the barrier metal materials.

Even if a Cu-based material such as a Cu—Sn alloy, a Cu—Ti alloy or a Cu—Al alloy commonly used in the semiconductor industry is used instead of Cu as the interconnection layer material in the embodiments described above, the same effects can be provided.

The porous insulation film material is not limited to the MSQ porous dielectric thin film material, but the same effects can be provided with the use of any other inorganic or organic porous insulative film material.

Particularly where a porous material having a lower dielectric constant is employed in the embodiments described above, remarkable effects can be provided. Examples of the porous insulation film material usable in the embodiments described above include various insulative materials such as silsesquioxane compounds, polyimides, fluorocarbons, parylene and benzocyclobutene.

Further, the thickness of the interlevel insulation film and the size, shape and number of the openings are properly determined depending on requirements for semiconductor integrated circuits and semiconductor devices.

Semiconductor device production methods which include the elements of the present invention and modifications conceived by those skilled in the art are all embraced in the scope of the invention.

Techniques such as a photolithography process and pre- and post-cleaning processes which are commonly used in the semiconductor industry are not explained for simplicity but, of course, these techniques are utilized in the present invention.

While the embodiments of the present invention have thus been described in detail, it should be understood that these embodiments are merely illustrative of the technical principles of the present invention but not limitative of the same. The spirit and scope of the present invention are to be limited only by the appended claims.

What is claimed is:

1. A semiconductor device production method comprising the steps of:
    forming a first interconnection layer on a substrate; and
    forming a second interconnection layer stacked directly on the first interconnection layer without intervention of a via layer,
    the first interconnection layer forming step including the steps of:
        forming a first insulation film;
        simultaneously forming a first interconnection opening and a first via opening in the first insulation film, so that the first interconnection opening and the first via opening extend through the first insulation film; and
        depositing a first electrically conductive material in the first interconnection opening and the first via opening,
    the second interconnection layer forming step including the steps of;
        forming a second insulation film stacked directly on the first insulation film;
        simultaneously forming a second interconnection opening and a second via opening in the second insulation film so that the second interconnection opening and the second via opening extend through the second insulation film; and
        depositing a second electrically conductive material in the second interconnection opening and the second via opening.

2. A semiconductor device production method as set forth in claim 1, wherein a low dielectric constant material film having a dielectric constant of not higher than 3.5 is formed as the insulation film in each of the first and second insulation film forming steps.

3. A semiconductor device production method comprising the steps of:
    forming a first interconnection layer, and
    forming a second interconnection layer stacked directly on the first interconnection layer without intervention of a via layer,
    the first interconnection layer forming step including the steps of
        forming a first insulation film,
        simultaneously forming a first interconnection opening and a first via opening in the first insulation film, so that the first interconnection opening and the first via opening extend through the first insulation film,
        depositing a first electrically conductive material on interiors of the first interconnection opening and first via opening and a surface of the first insulation film, and
        planarizing the first electrically conductive material,
    the second interconnection layer forming step including the steps of
        forming a second insulation film on the first interconnection layer, so as to be in direct contact with the first insulation film,
        simultaneously forming a second interconnection opening and a second via opening in the second insulation film, so that the second interconnection opening and the second via opening extend through the second insulation film,
        depositing a second electrically conductive material on interiors of the second interconnection opening and the second via opening and a surface of the second insulation film, and
        planarizing the second electrically conductive material.

4. A semiconductor device production method according to claim 3, wherein
    the first and second insulation film forming step each include the steps of
    forming an SiC film,
    forming a low-k film of a porous insulative material on the SiC film,
    subjecting a surface of the low-k film to a helium plasma treatment, and
    forming an $SiO_2$ film on the low-k film.

5. A semiconductor device production method according to claim 3, wherein the first and second electrically conductive material depositing step each include the steps of
    forming a barrier metal film,
    forming a seed film on the barrier film, and
    plating the seed film to form a plated film.

6. A semiconductor device production method according to claim 4, wherein the SiC film forming step includes a step of forming the SiC film on an $SiO_2$ film by a chemical vapor deposition method.

7. A semiconductor device production method according to claim 4, wherein the low-k film forming step includes the steps of
    applying a material solution by spin-coating, and
    heat-treating the solution.

8. A semiconductor device production method according to claim 4, wherein the helium plasma treatment includes modifying the surface of the low-k film in a CVD apparatus by irradiation with helium plasma.

9. A semiconductor device production method according to claim 4 wherein the $SiO_2$ film is a cap film formed on the low-k film.

10. A semiconductor device production method according to claim 5, wherein the barrier metal film forming step includes the step of forming the barrier metal film of a barrier metal material on the interiors of the corresponding openings and the surface of the corresponding insulation film.

11. A semiconductor device production method according to claim 5, wherein the seed film forming step includes the step of forming a seed film to be used as a cathode in the following plating step on the interiors of the corresponding openings and the surface of the corresponding insulation film covered with the barrier film by a physical vapor deposition method.

12. A semiconductor device production method according to claim 5, wherein the first and second planarizing steps each include the step of polishing away portions of the plated film, the seed film and the barrier metal film formed on the surface of the corresponding insulation film by a CMP method.

* * * * *